US006635928B2

(12) United States Patent
Mouli

(10) Patent No.: US 6,635,928 B2
(45) Date of Patent: Oct. 21, 2003

(54) SOI CMOS DEVICE WITH REDUCED DIBL

(75) Inventor: Chandra V. Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/212,625

(22) Filed: Aug. 1, 2002

(65) Prior Publication Data

US 2002/0190322 A1 Dec. 19, 2002

Related U.S. Application Data

(62) Division of application No. 09/652,864, filed on Aug. 31, 2000, now Pat. No. 6,503,783.

(51) Int. Cl.[7] .......................... H01L 27/01; H01L 27/12
(52) U.S. Cl. ..................................................... 257/347
(58) Field of Search ............................ 438/149; 257/49, 257/347

(56) References Cited

U.S. PATENT DOCUMENTS

| | | | | |
|---|---|---|---|---|
| 4,199,773 A | * | 4/1980 | Goodman et al. | 257/351 |
| 5,024,965 A | * | 6/1991 | Chang et al. | 438/154 |
| 5,164,805 A | * | 11/1992 | Lee | 257/351 |
| 5,231,045 A | | 7/1993 | Miura et al. | |
| 5,501,993 A | | 3/1996 | Borland | |
| 5,599,728 A | * | 2/1997 | Hu et al. | 438/289 |
| 5,614,433 A | * | 3/1997 | Mandelman | 438/154 |
| 5,942,781 A | * | 8/1999 | Burr et al. | 257/347 |
| 6,037,617 A | * | 3/2000 | Kumagai | 257/262 |

OTHER PUBLICATIONS

Heemyong Park et al., "Dopant Redistribution in SOI during RTA: A Studey on Doping in Scaled–down Si Layers", IEEE, 1999, pp 14.2.1 to 14.2.4.*
A.1.3.2 "Spurious Effects in Sub–Micron MOSFETs", http//www.iue.tuwien.ac.at/diss/schrom/diss/node90.html.*
2.7.2 Threshold Control, http:www.iue.tuwien.ac.at/diss/schrom/diss/node26.html.*
"Random discrete dopant flucuation", Ultra–thin channel SOI, http://www.resarch.ibm.com/0.1um/pwong.html.*

* cited by examiner

Primary Examiner—William David Coleman
(74) Attorney, Agent, or Firm—Knobbe, Martens, Olson & Bear, LLP

(57) ABSTRACT

A CMOS device formed with a Silicon On Insulator (SOI) technology with reduced Drain Induced Barrier Lowering (DIBL) characteristics and a method for producing the same. The method involves a high energy, high dose implant of boron and phosphorus through the p- and n-wells, into the insulator layer, thereby creating a borophosphosilicate glass (BPSG) structure within the insulation layer underlying the p- and n-wells of the SOI wafer. Backend high temperature processing steps induce diffusion of the boron and phosphorus contained in the BPSG into the p- and n-wells, thereby forming a retrograde dopant profile in the wells. The retrograde dopant profile reduces DIBL and also provides recombination centers adjacent the insulator layer and the active layer to thereby reduce floating body effects for the CMOS device.

14 Claims, 7 Drawing Sheets

T.A Fjeldly, T.Ytterdal, M.S. Shur, *Introduction to Device Modeling and Circuit Simulation*, Wiley, New York, 1998

SOI CMOS DEVICE WITH REDUCED DIBL

RELATED APPLICATIONS

This application is a divisional application of application Ser. No. 09/652,864 filed Aug. 31, 2000, now U.S. Pat. No. 6,503,783.

BACKGROUND OF THE INVENTION

1. Field of the Invention

The present invention relates to the field of semiconductor devices and fabrication processes and, in particular, to CMOS devices formed in a silicon-on-insulator (SOI) technology with reduced drain induced barrier lowering (DIBL) and a method for fabricating the same.

2. Description of the Related Art

There is an ever-present desire in the semiconductor fabrication industry to achieve individual devices with smaller physical dimensions. Reducing the dimensions of devices is referred to as scaling. Scaling is desirable in order to increase the number of individual devices that can be placed on a given area of semiconductor material and to increase the process yield and to reduce the unit cost of the devices and the power consumption of the devices. In addition, scaling can result in performance increases of the individual devices as the charge carriers with a finite velocity have a shorter distance to travel and less bulk material has to accumulate or dissipate charges. Thus, the trend in the industry is towards thinner device regions and gate oxides, shorter channels, and lower power consumption.

However, scaling often creates some performance drawbacks. In particular, a known category of performance limitations known as short channel effects arise as the length of the channel of CMOS devices is reduced by scaling. One particular short-channel effect in CMOS devices, known as Drain Induced Barrier Lowering (DIBL) is mainly responsible for the degradation of sub-threshold swing in deep submicron devices. DIBL is a reduction in the potential barrier between the drain and source as the channel length shortens as illustrated in FIG. 1 reflecting known prior art. When the drain voltage is increased, the depletion region around the drain increases and the drain region electric field reduces the channel potential barrier which results in an increased off-state current between the source and drain.

In conventional CMOS devices, a retrograde channel dopant profile can be effectively used to control DIBL. In a CMOS process, n-type and p-type wells are created for NMOS and PMOS devices. In a typical diffusion process, dopant concentration profiles in these n- and p-type wells are at a peak near the surfaces and decrease in the depth direction into the bulk as illustrated in FIG. 2. A retrograde profile is one in which the peak of the dopant concentration profile is not at the surface but at some distance into the bulk as shown in FIG. 3. Such retrograde profiles are helpful in deep submicron CMOS devices since they reduce the lowering of the source/drain barrier when the drain is biased high and when the channel is in weak inversion. This limits the amount of subthreshold leakage current flowing into the drain. A lower level of subthreshold leakage current provides improved circuit reliability and reduced power consumption.

A retrograde dopant profile also typically results in a lower dopant concentration near the surface of the wafer which reduces junction capacitances. Reduced junction capacitances allow the device to switch faster and thus increase circuit speed. Typically, retrograde profile dopant implants are done after formation of the gate. A halo (or pocket) implant is another known method used in deep submicron CMOS devices to reduce DIBL.

However in some applications, such as in an SOI process, it is difficult to create a retrograde profile due to the thinness of the silicon layer and the tendency of the dopants to diffuse. A SOI process has a buried insulating layer, typically of silicon dioxide. State-of-the-art SOI devices have a very thin silicon (Si) film (typically <1600 Å) overlying the oxide in which the active devices are formed. Increasing the Si film thickness any further will increase the extent to which the devices formed therein get partially depleted. SOI devices also suffer from 'floating body' effects since, unlike conventional CMOS, in SOI there is no known easy way to form a contact to the bulk in order to remove the bulk charges.

When the as-implanted retrograde dopant profiles diffuse during subsequent heat cycles in a process, they spread out and lose their 'retrograde' nature to some extent. In SOI, since the silicon film is very thin, creating a true retrograde dopant profile is very difficult. This is true even while using higher atomic mass elements like Indium (In) for NMOS and Antimony (Sb) as channel dopants. Diffusivity of these dopants in silicon is known to be comparable to lower atomic mass elements like boron (B) and phosphorus (P), when the silicon film is very thin, as in an SOI technology. Moreover, leakage current levels are known to increase when Indium is used for channel dopants (See "Impact of Channel Doping and Ar Implant on Device Characteristics of Partially Depleted SOI MOSFETs", Xu et al., pp. 115 and 116 of the Proceedings 1998 IEEE International SOI Conference, October, 1998 and "Dopant Redistribution in SOI during RTA: A Study on Doping in Scaled-down Si Layers", Park et al. IEDM 1999 pp. 337–340, included herein by reference).

From the foregoing it can be appreciated that there is an ongoing need for a method of fabricating deep submicron SOI CMOS devices while minimizing short channel effects such as DIBL. There is a further need for minimizing DIBL in deep submicron CMOS devices without incurring significant additional processing steps and high temperature processing.

SUMMARY OF THE INVENTION

The aforementioned needs are satisfied by the SOI CMOS device with reduced DIBL of the present invention. In one aspect, the invention comprises a semiconductor transistor device comprising: a semiconductive substrate; an insulative layer buried within the semiconductive substrate; an active layer of semiconductive material above the insulative layer; a plurality of doped device regions in the active layer; a gate structure formed on the device regions; source and drain regions formed in the device regions such that the doping type for the source and drain is complementary to the doping type of the corresponding device region; dopant diffusion sources placed within the buried insulator layer underlying the device regions wherein the dopant diffusion sources diffuse into the device regions so as to create a retrograde dopant profile in the device regions; a plurality of conductive layers electrically interconnecting the transistor devices; and a passivation layer overlying the conductive layers. In one embodiment, the semiconductive substrate, insulative layer buried within the semiconductive substrate, and the active layer of semiconductive material above the insulative layer comprise a SOI Separation by IMplanted OXygen (SIMOX) wafer.

Another aspect of the invention comprises dopant atoms implanted through the device regions such that the dopant atoms come to reside within the Buried OXide (BOX) layer underlying the device regions creating a borophosphosilicate glass (BPSG) within the BOX layer. Formation of the passivation layer causes the dopant atoms contained within the BPSG to diffuse into the device regions so as to create the retrograde dopant profile in the device regions. The retrograde dopant profile has a peak concentration substantially adjacent the interface of the BOX and the active region. The retrograde dopant profile in the device region provides the transistor device with improved resistance to drain-induced barrier lowering (DIBL) and also provides the transistor device with recombination centers to reduce floating body effects.

In another aspect, the invention comprises a method for creating semiconductor transistor devices comprising the steps of: providing a semiconductor substrate; forming a buried insulation layer in the semiconductor substrate; forming an active layer above the buried insulation layer by placing additional semiconductor material on the buried insulation layer; doping the active layer with dopant atoms so as to form device regions; implanting additional dopant atoms through the device regions such that the additional dopant atoms come to reside within the buried insulation layer underlying the device regions; implanting dopant atoms into gate regions of the device regions; forming a gate stack on the active layer adjacent the gate regions; implanting dopant atoms into the device regions such that the dopant atoms come to reside within the device regions adjacent the gate regions so as to form source and drain regions and wherein the gate stack substantially inhibits penetration of the dopant atoms into the gate regions of the device regions; forming conductive paths that electrically connect to the source, drain, and gate regions; and forming a passivating layer overlying the conductive paths. The method of the invention also includes implanting dopant atoms through the device regions wherein the dopant atoms come to reside within the BOX layer underlying the device regions thereby creating a borophosphosilicate glass (BPSG) within the BOX layer.

In another aspect of the invention, formation of the passivation layer induces the dopant atoms contained within the BPSG to outdiffuse into the device regions thereby forming a retrograde dopant profile within the device regions. The retrograde dopant profile within the device regions reduces DIBL effects for the CMOS device and also provides recombination centers adjacent the BOX active region interface thereby reducing floating body effects. These and other objects and advantages of the present invention will become more fully apparent from the following description taken in conjunction with the accompanying drawings.

DETAILED DESCRIPTION OF THE PREFERRED EMBODIMENT

Figure 1:
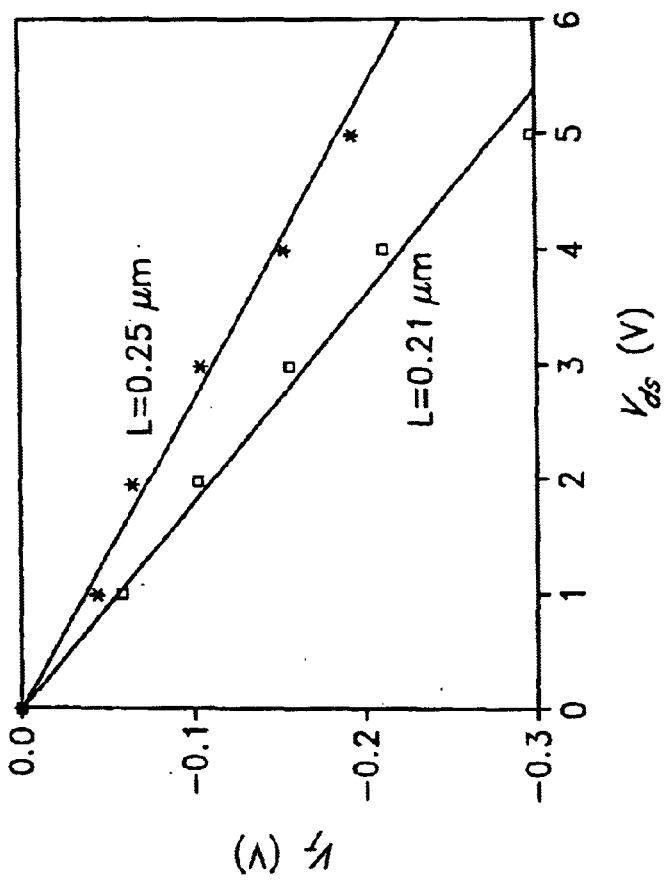
FIG. 1 is a graph illustrating prior art concerning DIBL as the relation of threshold voltage ($V_T$) to drain-source voltage ($V_{DS}$) for various sub-micron channel lengths.
Figure 3:
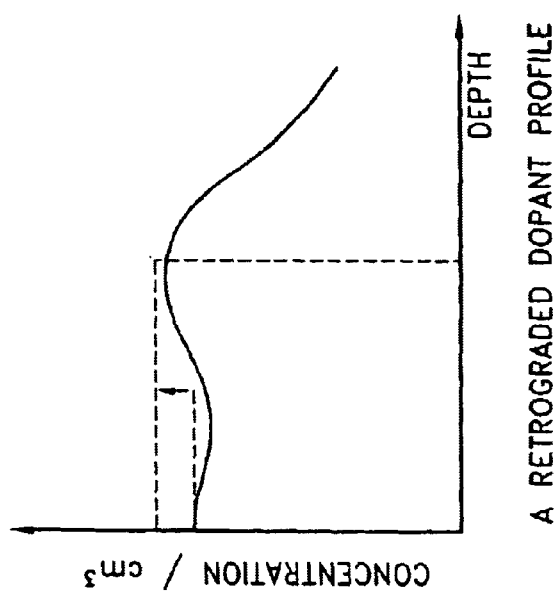
FIG. 3 is a graph illustrating prior art of a retrograde dopant profile in CMOS devices.
Figure 2:
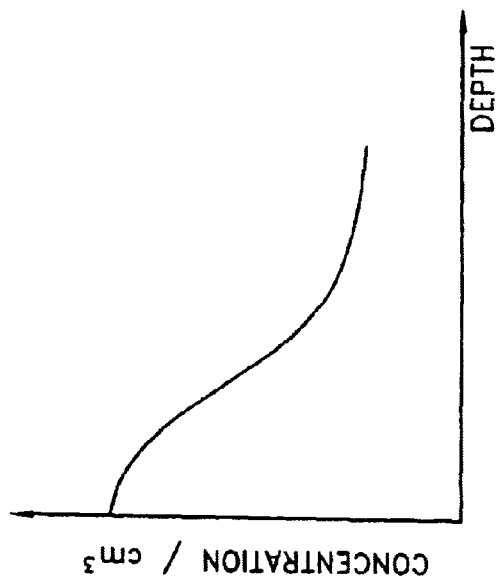
FIG. 2 is a graph illustrating prior art of a typical diffusion based dopant profile in CMOS devices.
Figure 4:
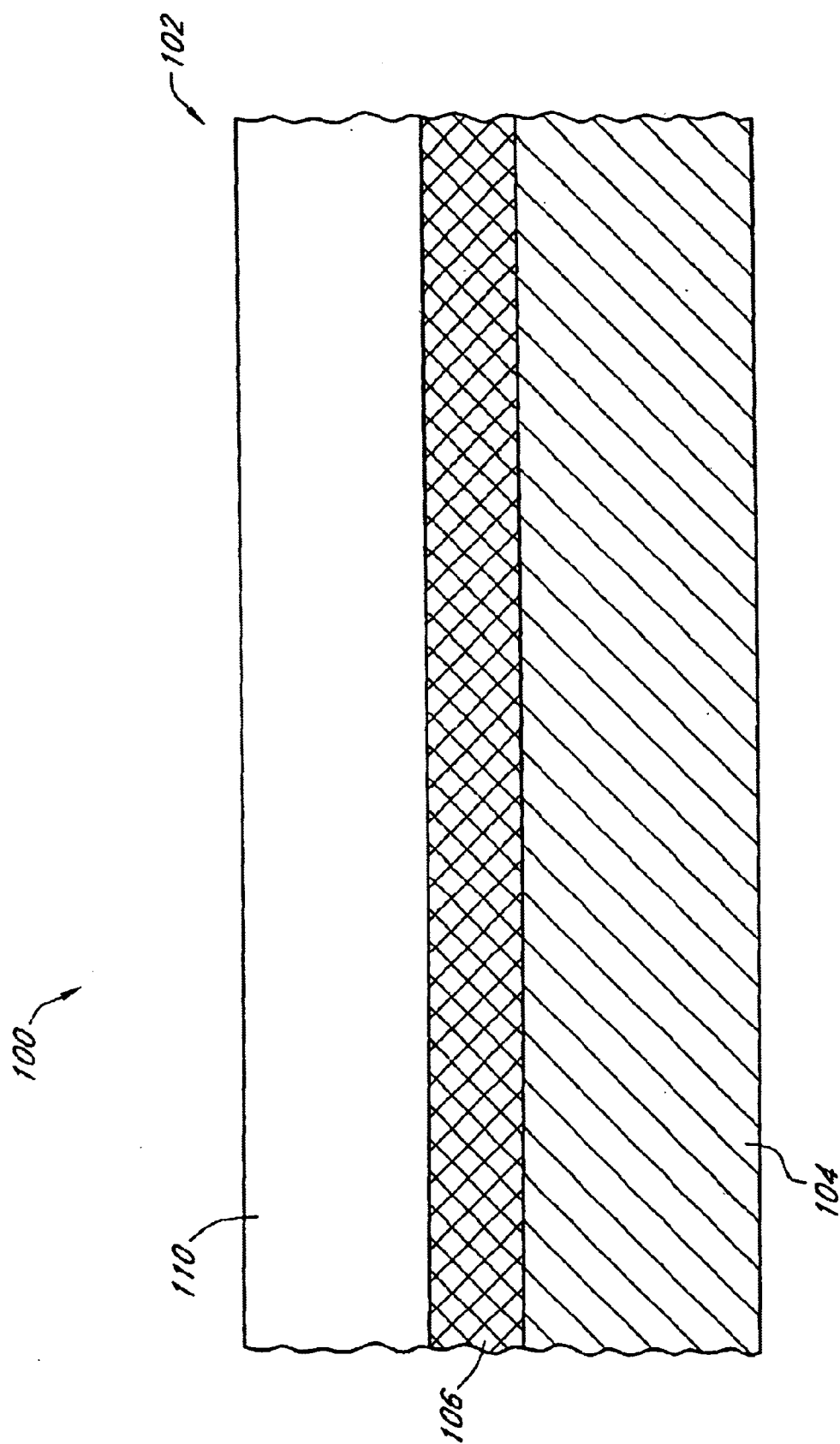
FIG. 4 is a section view of the starting material of the SOI CMOS with reduced DIBL, a SIMOX wafer.

Reference will now be made to the drawings wherein like numerals refer to like structures throughout. FIG. 4 is a section view of one embodiment of the SOI CMOS with reduced DIBL 100 of the present invention showing the starting SOI material, a Separation by IMplanted OXygen (SIMOX) wafer 102. The, SIMOX wafer 102 is well known in the art and comprises a silicon substrate 104 in which a layer of the substrate 104 is converted to a buried silicon dioxide (BOX) 106 layer with a heavy oxygen implant and subsequent anneal. An epitaxial layer 110 of Si approximately 500 Å to 2500 Å thick is then grown on top of the BOX layer 106. The BOX layer 106 of the SIMOX wafer 102 provides electrical insulation between the active region of the epitaxial layer 110 and the bulk silicon of the substrate 104. Thus, active devices formed in the epitaxial layer 110 are electrically isolated from the semiconductive substrate 104. The SIMOX wafer 102 also provides physical structure as well as reactive material for formation of the SOI CMOS with reduced DIBL 100 in a manner that will be described in greater detail below.

In the description of the SOI CMOS with reduced DIBL 100 that follows, a single CMOS 130 structure comprising PMOS 132 and NMOS 134 (FIG. 7) devices will be used to illustrate the invention. It should be appreciated that the process herein described for one CMOS 130 device also applies to forming a plurality of SOI CMOS with reduced DIBL 100 devices. It should also be appreciated that the invention herein described can be modified by one skilled in the art to achieve a PMOS 132, an NMOS 134, or other technology employing the methods herein described without detracting from the spirit of the invention. It should also be understood that FIGS. 4–7 are illustrative and should not be interpreted as being to scale.

Figure 5:
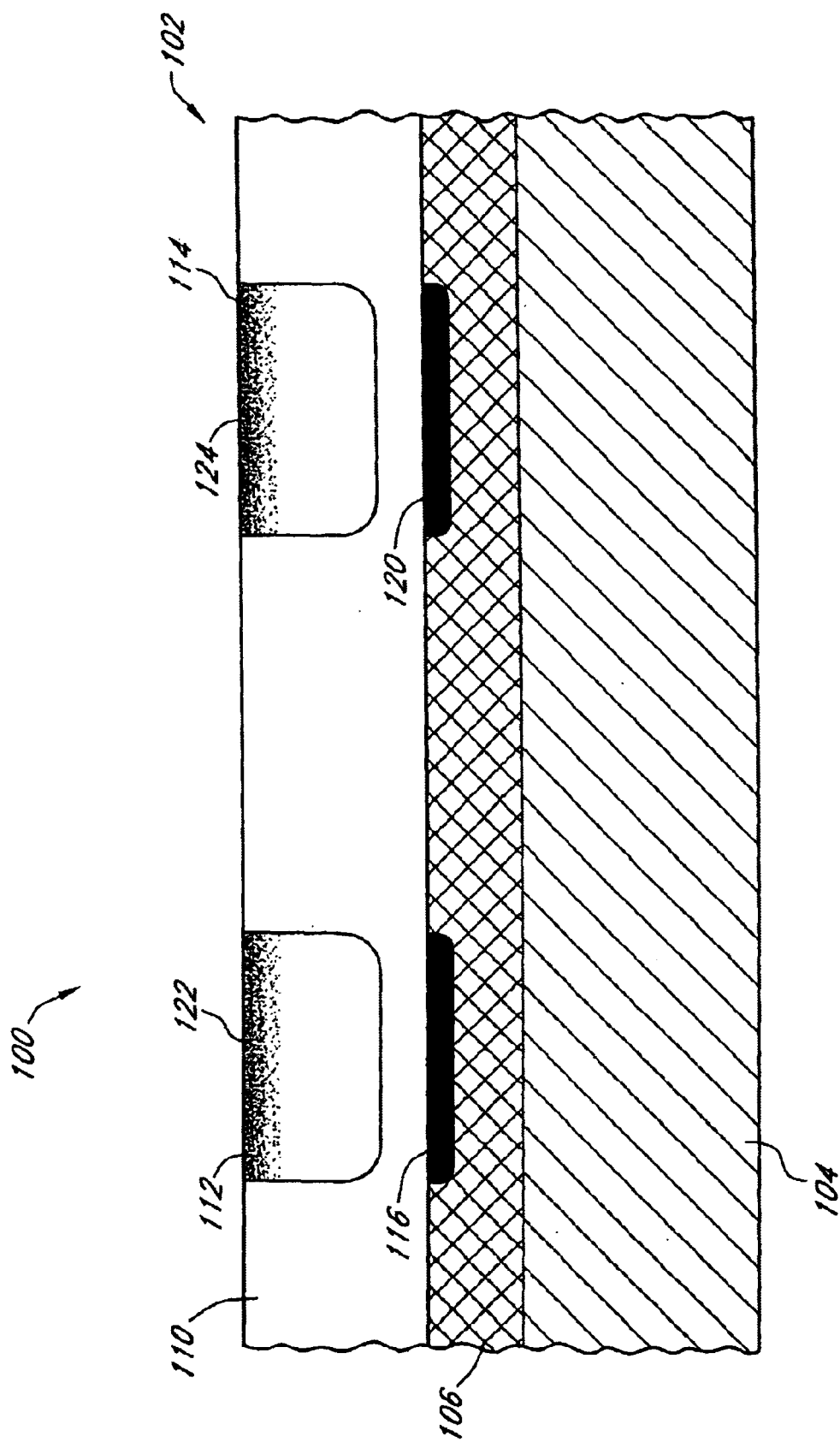
FIG. 5 is a section view of the SIMOX wafer with n- and p-type wells formed therein and a high dose, high energy implant, into the buried oxide (BOX) forming a borophosphosilicate glass (BPSG) structure.
Figure 7:
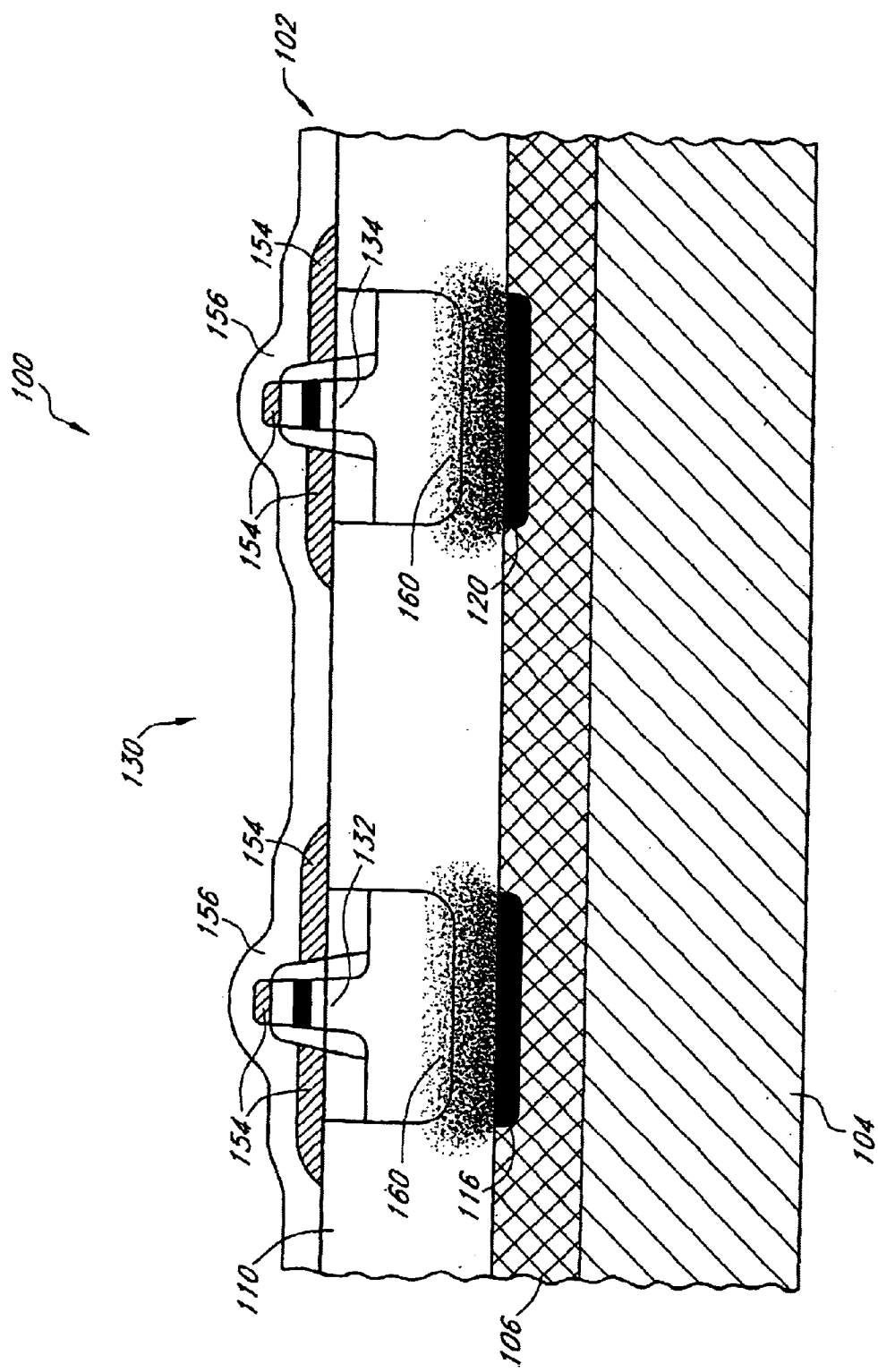
FIG. 7 is a section view of the SOI CMOS devices with conductive and passivation layers in place with the dopants entrained within the BPSG outdiffuse into the n- and p-wells thereby forming a retrograde dopant profile within the wells that reduces DIBL.

The method of forming the SOI CMOS with reduced DIBL 100 then comprises creating n-well 112 and p-well 114 regions as shown in FIG. 5. The n-well 112 and p-well 114 regions are created, in this embodiment, by implanting a dose of approximately 1e13/cm² of P @ 60 keV to create the n-well 112 and a dose of approximately 1e13/cm² of B @ 30 keV to create the p-well 114. The n-well 112 and p-well 114 are then driven at a temperature of approximately 800° C. for a period of approximately 30 minutes. The n-well 112 and p-well 114 provide regions for the subsequent formation of the PMOS 132 and NMOS 134 devices that comprise a CMOS 130 device (FIG. 7).

The method of forming the SOI CMOS with reduced DIBL 100 then comprises high energy, high dose n-type diffusion source 116 and p-type diffusion source 120 implants into the p-well 114 and n-well 112 respectively as shown in FIG. 5. The n-type diffusion source 116 and p-type diffusion sources 120 comprise borophosphosilicate glass (BPSG). The n-type diffusion source 116 and p-type diffusion source 120 implant parameters should be tailored in such a way that the resultant n-type diffusion source 116 and p-type diffusion source 120 dopant profiles mainly reside in the BOX layer 106. In one embodiment, the n-type diffusion source 116 implant comprises an implant of phosphorus through the n-well 112 of approximately $2.0e14/cm^2$ @ 220 keV into the BOX layer 106 and the p-type diffusion source 120 implant comprises an implant of boron through the p-well 114 of approximately $2.0e14/cm^2$ @ 100 keV into the BOX layer 106. In this embodiment, the final n-type diffusion source 116 and p-type diffusion source 120 dopant concentration in the BOX 106 is preferably at least $10^{20}cm^{-3}$. As will be described in greater detail below, the diffusion sources 116, 120 provide a source of dopant atoms that can diffuse into the wells 112, 114 respectively to create a retrograde dopant profile.

The method of forming the SOI CMOS with reduced DIBL 100 then comprises threshold voltage (vt) adjust implants 122, 124 as shown in FIG. 5. The threshold voltage adjust implants 122, 124 adjust the threshold voltage of the PMOS 132 and NMOS 134 devices either upwards or downwards in a manner known in the art. The threshold voltage adjust implants 122, 124 comprise, in this embodiment, a PMOS gate adjust 122 implant of $BF_2$ at a dose of approximately 5e12 to 1e13 @ 25-35 keV and an NMOS gate adjust 124 implant of Arsenic at a dose of approximately 5e12 to 1e13 @ 35–50 keV. The PMOS gate adjust 122 and the NMOS gate adjust 124 modify the dopant concentration in the gate region of the PMOS 132 and NMOS 134 devices so as to adjust the resultant threshold voltage of the PMOS 132 and NMOS 134 devices to a desirable level.

Figure 6:
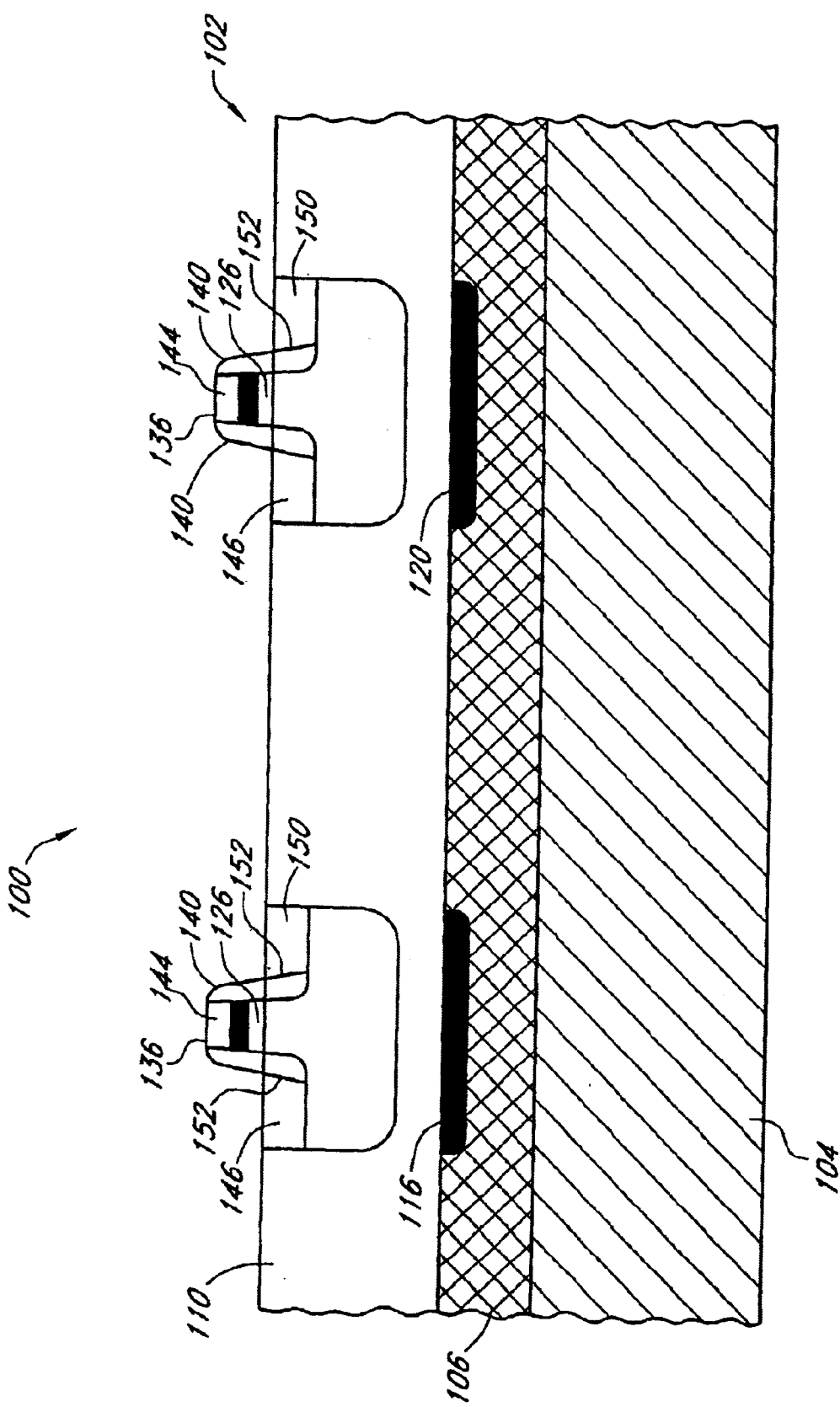
FIG. 6 is a section view of the SIMOX wafer with gate stacks formed on the n-and p-wells with source and drain implants.

The method of forming the SOI CMOS with reduced DIBL 100 then comprises formation of a gate stack 136 as shown in FIG. 6. The gate stack 136 comprises a gate oxide 126, sidewalls 140, a nitride layer 142, and doped polysilicon 144. The gate oxide 126 in this embodiment comprises a layer of silicon dioxide approximately 50 Åthick. The gate oxide 126 electrically isolates the n-well 112 and p-well 114 regions of the epitaxial silicon 110 from overlying conductive layers that will be described in greater detail below. The sidewalls 140 comprise silicon dioxide that is grown and subsequently anisotropically etched in a known manner to create the structures illustrated in FIG. 6. The sidewalls 140 electrically isolate the gate stack 136 from source/drain conductive layers and facilitates formation of source/drain extensions in a manner that will be described in greater detail below. The nitride layer 142 comprises a layer that is substantially silicon nitride approximately 450 Å thick emplaced in a known manner. The nitride layer 142 inhibits subsequent passage of Boron from the p+ polysilicon layer 144. The doped polysilicon 144 comprises heavily p-type doped polysilicon for the PMOS 132 device and heavily n-type doped polysilicon for the NMOS 134. The doped polysilicon 144 provides a reduced work function for the gates of the PMOS 132 and NMOS 134 (FIG. 7) and thus a lower contact resistance and corresponding faster device response.

The method of forming the SOI CMOS with reduced DIBL 100 then comprises formation of the source 146 and drain 150 as shown in FIG. 6. The source 146 and drain 150 are formed by implanting $BF_2$ with a dose of approximately $2e15/cm^2$ @ 15 keV for the PMOS 132 and As with a dose of approximately $2e15/cm^2$ @ 10 keV for the NMOS 134. As can be seen from FIG. 6 the implantation of the source 146 and drain 150 is partially masked by the gate stack 136 and results in source/drain extensions 152. The source/drain extensions 152 are lower concentration regions of the source 146 and drain 150 that partially extend under the sidewalls 140. The source/drain extensions 152 reduce the peak electric field under the gate and thus reduce hot carrier effects in a known manner.

The method of forming the SOI CMOS with reduced DIBL 100 then comprises formation of a conductive layer 154 (FIG. 7). In this embodiment, the conductive layer 154 comprises a layer of metallic silicide (titanium silicide or cobalt silicide) emplaced in a well known manner. The conductive layer 154 is placed so as to be in physical and electrical contact with the source 146, the drain 150, and the doped polysilicon 144 of the gate stack 136. The conductive layer 154 interconnects the CMOS 130 with other circuit devices on the SIMOX wafer 102 in a known manner.

The method of forming the SOI CMOS with reduced DIBL 100 then comprises formation of a passivation layer 156 (FIG. 7) overlying the structures previously described. In this embodiment, the passivation layer 156 comprises a layer of oxide, BPSG, or polysilicon approximately 3000 Å thick formed in a known manner. The formation of the passivation layer 156 involves a high temperature process.

The n-type diffusion source 116 and the p-type diffusion source 120 previously implanted into the BOX layer 106 in the manner previously described serve as solid-sources for dopant diffusion. When the passivation layer 156 is formed on the SIMOX wafer 102 with attendant heat steps, dopants contained in the n-type 116 and the p-type 120 diffusion sources will outdiffuse into the epitaxial silicon 110, creating a thin, highly doped retrograde profile region 160 as shown in FIG. 7. In the case of the p-well 114, the retrograde profile region 160 will comprise boron and, in the n-well 112, the retrograde profile region 160 will comprise phosphorus. The retrograde profile region 160 layer will act as a punch-through prevention layer to control DIBL.

Figure 9:
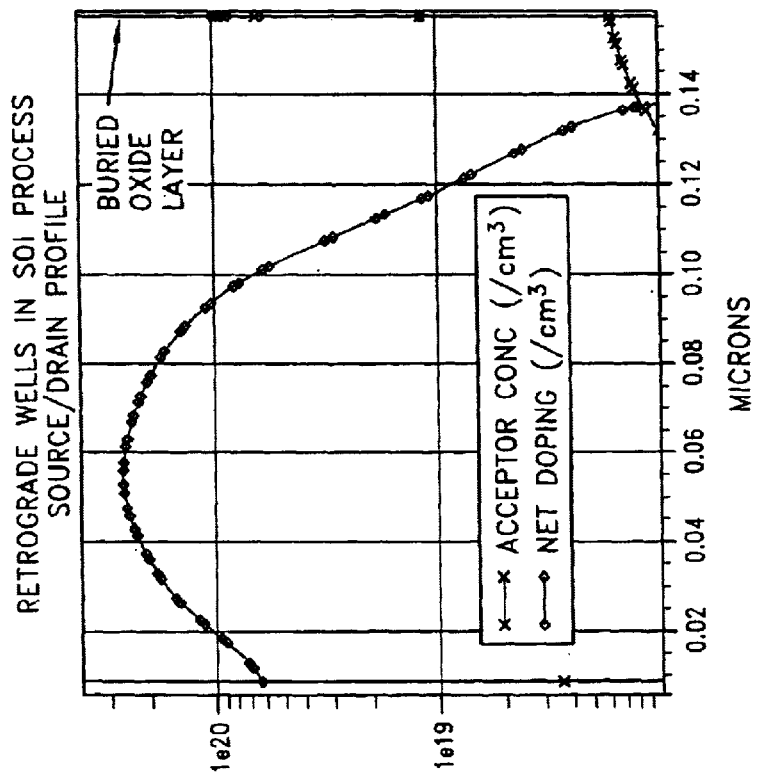
FIG. 9 is a graph illustrating the dopant concentration in the source/drain regions of a SOI CMOS of the present invention as a function of depth in the substrate from the surface to the buried oxide layer.
Figure 8:
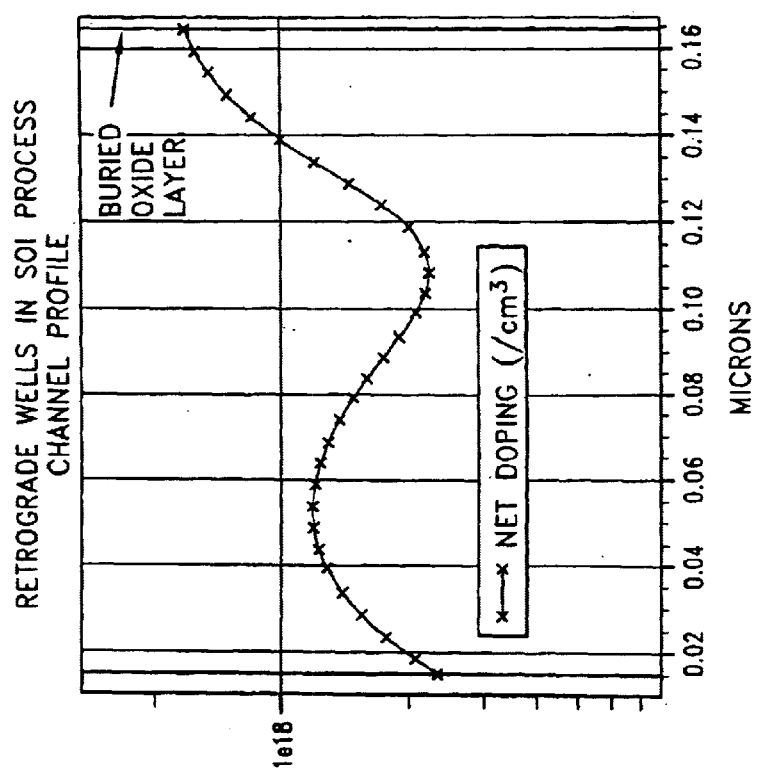
FIG. 8 is a graph illustrating the net dopant concentration in the channel (gate) region of a SOI CMOS of the present invention as a function of depth into the substrate from the surface to the buried oxide layer.

FIG. 8 shows the net dopant profile in a vertical outline in the middle of the channel region. The boron concentration increases from $9.0e17/cm^3$ to $2.0e18/cm^3$, which is nearly a 120% increase, at the BOX 106/silicon substrate 104 interface. FIG. 9 shows the dopant profile in the source 146 and drain 150 regions. The source 146 and drain 150 implants in this embodiment of the SOI CMOS with reduced DIBL 100 reach close to the BOX layer 106 as can be seen from FIG. 9. As such the source 146 and drain 150 implants will compensate the outdiffused dopants from the n-type 116 and p-type 120 diffusion sources in the retrograde profile region 160 close to the interface of the BOX 106 and the silicon substrate 104. This will reduce the junction capacitance of the SOI CMOS with reduced DIBL 100 even further as compared to a process with halo implants.

The dopants contained within the retrograde profile region 160 will also create recombination centers near the BOX 106/silicon substrate 104 interface. These recombination centers are an added benefit in the SOI CMOS with reduced DIBL 100 since the recombination centers tend to reduce the floating body effects in the SOI CMOS with reduced DIBL 100.

Hence, the process of the illustrated embodiment provides a method in which a retrograde doping profile can be created in thin semiconductor active areas such as the active areas used in silicon-on-insulator (SOI) applications. The process of the illustrated embodiment does not significantly add to the processing of the device as only discrete implantation steps are required and the diffusion is obtained through the additional thermal processing of the device. Thus, retrograde profiles can be created in a manner that does not significantly increase the processing costs of the device.

Although the preferred embodiments of the present invention have shown, described and pointed out the fundamental novel features of the invention as applied to those embodiments, it will be understood that various omissions, substitutions and changes in the form of the detail of the device illustrated may be made by those skilled in the art without departing from the spirit of the present invention. Consequently, the scope of the invention should not be limited to the foregoing description but is to be defined by the appended claims.

What is claimed is:

1. A semiconductor transistor device comprising:
    a semiconductive substrate;
    an insulative layer buried within the semiconductive substrate;
    an active layer of semiconductive material above the insulative layer;
    a plurality of doped device regions in the active layer;
    a gate structure formed on the device regions;
    source and drain regions formed in the device regions such that the doping type for the source and drain is complementary to the doping type of the corresponding device region; and
    dopant diffusion sources placed within the buried insulator layer underlying the device regions wherein the dopant diffusion sources diffuse into the device regions so as to create a retrograde dopant profile in the device regions.

2. The device of claim 1, wherein the transistor device comprises a field effect transistor.

3. The device of claim 2, wherein the field effect transistor comprises a PMOS device.

4. The device of claim 2, wherein the field effect transistor comprises an NMOS device.

5. The device of claim 2, wherein the field effect transistor comprises a CMOS device.

6. The device of claim 1, wherein the semiconductive substrate comprises a silicon wafer.

7. The device of claim 6, wherein the insulative layer buried within the semiconductive substrate comprises an implanted buried silicon dioxide (BOX) layer.

8. The device of claim 7, wherein the active layer of semiconductive material above the insulative layer comprises a layer of epitaxial silicon.

9. The device of claim 8, wherein the silicon wafer with the BOX layer and the overlying layer of epitaxial silicon comprises a SIMOX wafer.

10. The device of claim 9, wherein the plurality of doped device regions in the active layer are complementarily doped.

11. The device of claim 10, wherein the diffusion of the dopant diffusion source into the device regions so as to create the retrograde dopant profile in the device regions occurs during formation of a passivation layer.

12. The device of claim 11, wherein the retrograde dopant profile has a peak concentration substantially adjacent the interface of the BOX and the active region.

13. The device of claim 12, wherein the retrograde dopant profile in the device region provides the transistor device with improved resistance to drain-induced barrier lowering (DIBL).

14. The device of claim 12, wherein the retrograde dopant profile in the device region provides the transistor device with recombination centers to reduce floating body effects in the transistor device.

* * * * *